(12) United States Patent
Mashino

(10) Patent No.: US 6,548,891 B2
(45) Date of Patent: Apr. 15, 2003

(54) SEMICONDUCTOR DEVICE AND PRODUCTION PROCESS THEREOF

(75) Inventor: Naohiro Mashino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/003,448

(22) Filed: Oct. 23, 2001

(65) Prior Publication Data

US 2002/0053730 A1 May 9, 2002

(30) Foreign Application Priority Data

Oct. 24, 2000 (JP) ........................................ 2000-323949

(51) Int. Cl.[7] .............................................. H01L 23/12
(52) U.S. Cl. ........................................ 257/700; 257/666
(58) Field of Search ................................ 257/700, 666, 257/698

(56) References Cited

U.S. PATENT DOCUMENTS 6,372,540 B1 * 4/2002 Huemoeller ................. 438/106
6,396,140 B1 * 5/2002 Juneja et al. ................ 257/700

* cited by examiner

*Primary Examiner*—Phat X. Cao
(74) *Attorney, Agent, or Firm*—Paul & Paul

(57) ABSTRACT

In the production of semiconductor devices, a surface of the portion corresponding to the chip packaging area of the glass substrate is treated with plasma in a vacuum, a silicon chip is bonded-through its surface opposed to an electrode-bearing surface of the same to the activated surface of the glass substrate, and a wiring pattern having a predetermined configuration is formed in such a manner that a conductor exposed from the glass substrate is connected with an electrode of the silicon chip.

12 Claims, 7 Drawing Sheets

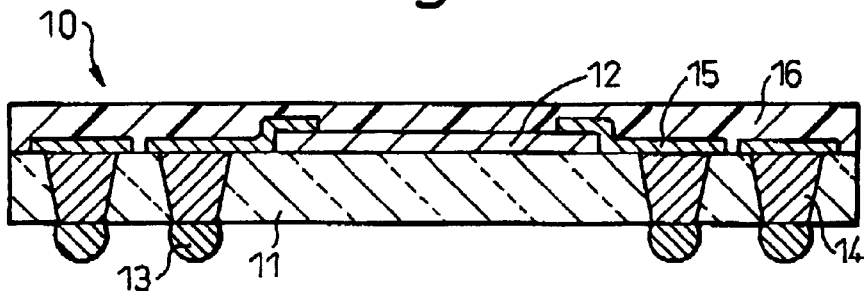
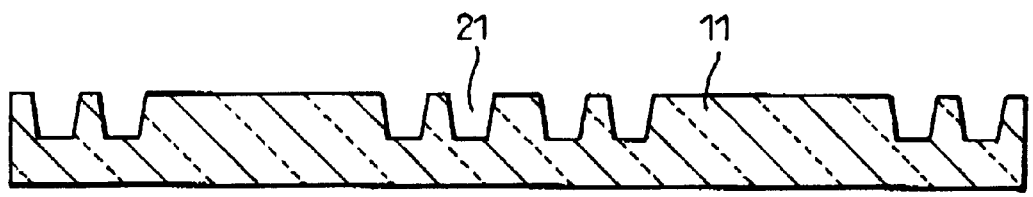
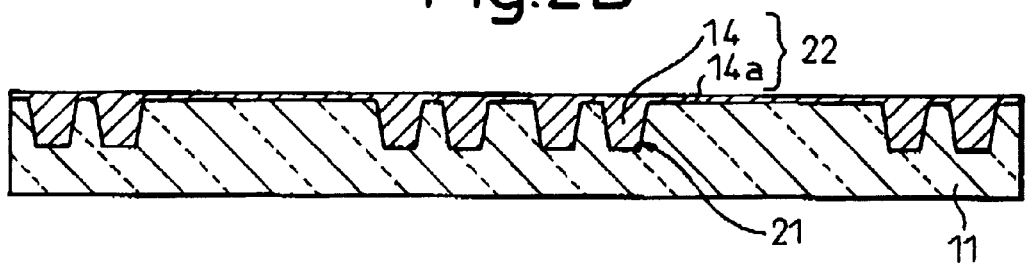
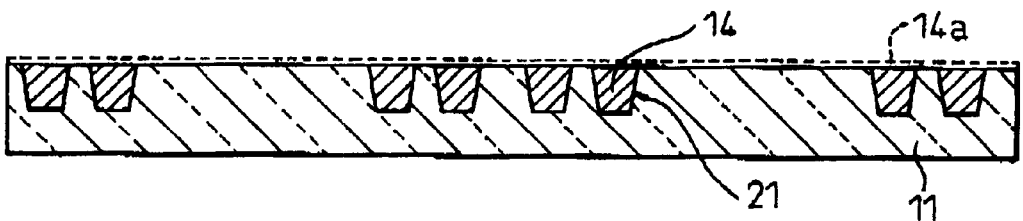

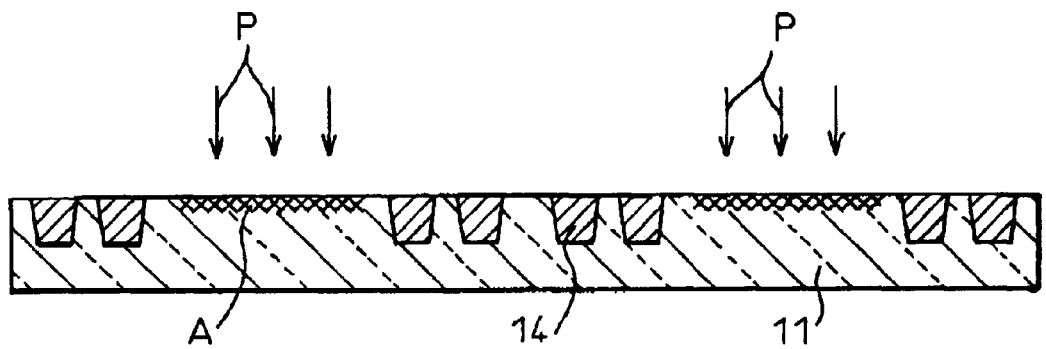
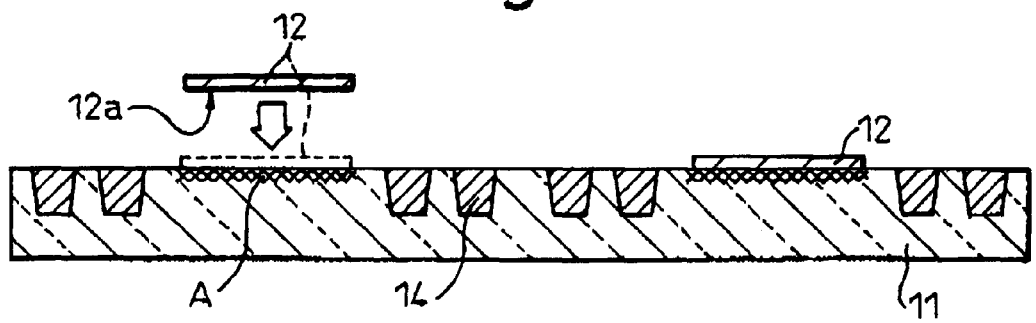
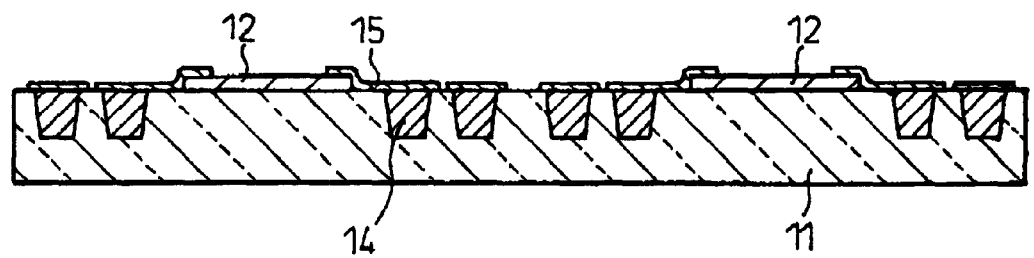

SEMICONDUCTOR DEVICE AND PRODUCTION PROCESS THEREOF

BACKGROUND OF THE INVENTION

1. Field of the Invention

The present invention relates to a semiconductor device and a production process thereof. More particularly, the present invention relates to a technology for simplifying the production process and reduce production costs, while considering prevention of adverse environmental effects in the production of semiconductor devices in which a semiconductor chip such as a bare chip and the like is attached onto a wiring substrate.

2. Description of the Related Art

In the production of semiconductor devices, to ensure electrical functions of a semiconductor element such as an IC chip or an LSI chip (hereinafter referred to as a "semiconductor chip") after its formation and dicing on a silicon wafer, it is necessary to electrically connect an electrode of the semiconductor chip to a wiring pattern formed on the wiring substrate. Further, as is well-known in the art, a wire bonding system and a flip chip bonding system have been suggested for carrying out such electrical connection (the so-called attachment of chips).

In the wire bonding system, after formation of a wiring pattern on a wiring substrate, a semiconductor chip is bonded to a wiring substrate by adhering a lower surface (surface opposed to a surface having an electrode) of the semiconductor chip through an adhesive to a surface (wiring-bearing surface) of the wiring substrate, followed by electrically connecting through a bonding wire the electrode of the semiconductor chip with the wiring of the wiring substrate.

On the other hand, in the flip chip bonding system, after formation of the wiring pattern on the wiring substrate as in the wire bonding system mentioned above, a metal bump such as a solder bump is applied to an electrode pad of the semiconductor chip, and the metal bump is electrically connected through an anisotropic conductive sheet or the like to the wiring (land) on the wiring substrate.

More specifically, in all of the prior art electrical connection systems, it was necessary to separately conduct the formation of the wiring and attachment of chips. Further, in the attachment of chips, it was necessary to use a bonding means such as solder and the like for the electrical connection between the chip and the wiring.

SUMMARY OF THE INVENTION

As described above, according to the prior art methods, since the fabrication step for forming a wiring on a wiring substrate and the chip attachment step for electrically connecting the wiring with a semiconductor chip have to be separately carried out in the production of semiconductor devices, there was a problem in that the production process for the semiconductor devices was relatively complicated and thus the production cost increased.

Further, in the case wherein the semiconductor devices are produced by using a wire bonding connecting system, since a bonding wire is applied at a higher position than the surface level of the electrode on the semiconductor chip, there was a disadvantage in that the total height of the semiconductor devices is relatively increased. Such an increase in the height of the devices goes against a recent trend of producing thin semiconductor devices.

Further, there was a similar disadvantage in the production of semiconductor devices in using a flip chip bonding system, in that the total height of the semiconductor devices is relatively increased, because a bump has to be applied between a wiring substrate and a semiconductor chip. This is because the total height of the semiconductor devices increases relatively in conformity with the size of the applied bump.

Furthermore, since a soldering process is frequently used for the bonding of a wiring circuit with a semiconductor chip in the attachment of the chip, there was a problem in that a solder used may cause environmental pollution.

The present invention is therefore directed to solve the prior art problems, described above, in the production of semiconductor devices.

The object of the present invention is to provide a semiconductor device which enables production of the device in a simplified process and at a reduced production cost, and also enables a reduction in the thickness of the device while inhibiting adverse effects on the environment, along with a production process for such a semiconductor device.

In one aspect thereof, the present invention resides in a semiconductor device comprising a wiring substrate having attached thereon at least one semiconductor element, in which the semiconductor element is directly bonded through a Coulomb's force created between radicals of the atoms constituting the semiconductor element and reactive radicals on a surface of the wiring substrate, and a wiring pattern formed on the surface of the wiring substrate extends onto a surface of the semiconductor element and is electrically connecting with an electrode and the like formed on the surface of the semiconductor element.

In the semiconductor device according to the present invention, the semiconductor element used herein is not restricted to a specific one. As described above, the semiconductor element includes an IC chip, an LSI chip and others. Of course, if desired, the semiconductor device may include any other elements or parts which are conventional in the field of semiconductor devices. In the semiconductor device of the present invention, it is preferred that the wiring pattern, when viewed at an end portion of the semiconductor element, have a planarized surface. In other words, the height of the wiring pattern at such an end portion should be substantially the same as that of the wiring pattern on the wiring substrate, and the wiring pattern extends on a substantially even surface, i.e. there is no substantial step in a surface of the wiring pattern at the end portion of the semiconductor element adjacent to a portion having no underlying semiconductor element. Since the wiring pattern can be produced to have a substantially flat surface and a reduced thickness, it becomes possible to produce thinner semiconductor devices along with prevention of permeation of a liquid into a gap between the wiring pattern and the underlying semiconductor element or wiring substrate.

Further, the semiconductor element may be used without applying any surface treatment to a bonding surface thereof, but it is preferred that the bonding surface of the semiconductor element be subjected to a mirror polishing process to make a mirror surface. Since a Coulomb's force can be increased in proportion to the surface area of the bonding or contacting surface of the semiconductor element, increased bonding strength of the element can be obtained when the contacting surface is increased as a result of the polishing process.

A surface of the wiring substrate to which a semiconductor element is bonded is preferably activated with a plasma treatment to generate reactive radicals on the surface thereof. In this plasma treatment, if the wiring substrate used is made of a silicon substrate, it is preferred that the plasma treatment be carried out with irradiation of ultraviolet radiation.

Further, to ensure good electrical communication between an upper surface and a lower surface of the wiring substrate, it is preferred that the wiring substrate further have a conductor formed through the substrate. In the conductor formed through the wiring substrate, it is preferred that an end surface of the conductor exposed at a semiconductor element side of the wiring substrate be electrically connected with a wiring pattern formed on the wiring substrate. On the other hand, it is preferred that another end surface of the conductor exposed at another surface of the wiring substrate opposed to the semiconductor element side further comprise an external connecting terminal, although the other end surface of the conductor may be directly used as an external connecting terminal without applying any conducting means.

Furthermore, it is preferred that the wiring substrate and thus the semiconductor device have a protective insulating layer as the uppermost layer. The presence of the protective insulating layer is effective in protecting the semiconductor element, the wiring pattern and the like from undesirable external influences such as permeation of water and to prevent electrical defects such as disconnection and short-circuiting.

The semiconductor device of the present invention may further comprise one or more additional semiconductor elements in addition to the semiconductor element directly attached to the wiring substrate. The additional semiconductor element can include any elements or parts conventionally used in semiconductor devices. For example, the additional semiconductor element can be attached to the wiring substrate, after an opening portion is formed at a predetermined site of the insulating layer covering the semiconductor device to expose the underlying wiring pattern. The additional semiconductor element is attached through the opening portion to the semiconductor substrate. The opening portion may be filled with any electrical conducting material to assist in bonding between the semiconductor element and the wiring pattern.

In the semiconductor device of the present invention, the wiring substrate and the semiconductor element both may be formed using any substrate materials, depending on the details of the semiconductor device to be produced and other factors. However, to attain good electrostatic adhesion based on the Coulomb's force, it is preferred that the wiring substrate and a substrate of the semiconductor element have substantially the same crystal orientation direction. For example, it in preferred that the wiring substrate be made using a glass substrate, and the semiconductor element be made using a silicon substrate. It is also preferred that the wiring substrate be made using a silicon substrate having an insulating layer, generally a silicon oxide layer, on a surface thereof, with the semiconductor element being made using a silicon substrate. Of course, other substrate materials may be used, if desired.

The semiconductor device of the present invention may be used alone or in combination of two or more devices. For example, two or more semiconductor devices may be stacked to form a semiconductor device having a three-dimensionally extending attaching structure. In this attaching structure, it is preferred that an external connecting terminal and the like formed on the wiring substrate of an upper semiconductor device be electrically connected with the wiring pattern of a lower semiconductor device adjacent to the upper semiconductor device.

In another aspect thereof, the present invention resides in a process for the production of a semiconductor device comprising a wiring substrate having attached thereto at least one semiconductor element, which process comprises the steps of;
   generating reactive radicals on a surface of the wiring substrate;
   directly bonding the semiconductor element, through a Coulomb's force created between radicals of the atoms constituting the semiconductor element and the reactive radicals, on a surface of the wiring substrate; and
   forming a wiring pattern at a predetermined pattern on the surface of the wiring substrate, the wiring pattern extending onto a surface of the semiconductor element and electrically connected with an electrode and the like formed on the surface of the semiconductor element.

As will be easily appreciated from the above description of the semiconductor device, the production process for the semiconductor device according to the present invention can be advantageously carried out in different embodiments.

For example, a wiring pattern is preferably formed in such a manner that the wiring pattern covers an end portion of the semiconductor element, while maintaining a planarized and thus substantially flat surface over the semiconductor element and the adjacent wiring substrate. Preferably, the flat surface is obtained in the wiring pattern by depositing the wiring pattern at a relatively high thickness, in accordance with a so-called "thick-layer forming method". The thick-layer forming method is preferably carried out by depositing, in sequence, at least two plating layers on the wiring substrate. More preferably, the wiring pattern is formed as a two-layered plating layer by using a combination of an electroless plating step and the subsequent electrolytic plating step. For example, the wiring pattern can be formed in a relatively high-thickness by plating a Ni layer, followed by plating a Cu layer.

In particular, the production process for the semiconductor device of the present invention can be advantageously carried out by the steps of:
   forming a conductor, to a lower end surface of which an external connecting terminal is electrically connected, in a region surrounding a chip mounting area on a surface of a glass substrate;
   treating, in a vacuum, a surface of the portion, corresponding to the chip mounting area, of the glass substrate with plasma to form an activated surface in the glass substrate;
   bonding, in a vacuum, a silicon chip through its surface, opposed to an electrode-bearing surface of the same, to the activated surface of the glass substrate;
   forming a wiring pattern having a predetermined configuration on the glass substrate in such a manner that an upper end surface of the conductor in the glass substrate is electrically connected with the electrode of the silicon chip; and
   polishing a lower surface of the glass substrate opposed to a pattern-bearing surface thereof until a lower and surface of the conductor is exposed from the lower surface, thereby providing a thinned glass substrate having a predetermined thickness.

Further, it is preferred that the production process further comprise the step of bonding a metal bump as an external connecting terminal to the lower end surface of the conductor after thinning of the glass substrate.

Furthermore, it is preferred in the production process that, prior to bonding the silicon chip to the activated surface of the glass substrate, a surface of the silicon chip opposed to an electrode-bearing surface thereof be plasma treated to provide the activated surface.

According to the semiconductor device and its production process according to the present invention, a silicon chip in the form of a thin film can be directly bonded to a glass substrate by utilizing an adhesion phenomenon (electrostatic adhesion) based on a Coulomb's force between reactive radicals on the glass substrate and silicon (Si) atoms of the silicon chip, since a surface of the glass substrate is treated with plasma to activate the surface, thereby producing reactive radicals around the activated surface, while the silicon chip is constituted from the Si atoms. At the same time, in the formation of a wiring pattern to be electrically connected through a conductor or electrically conducting means to an external connecting terminal of the glass substrate, a connection between the wiring pattern and an electrode of the silicon chip, i.e. attachment of chip, can be carried out simultaneously. More specifically, according to the present invention, the formation of the wiring pattern and the attachment of the chips, which were both separately carried out in the case of prior art devices, can be carried out in a single step for forming a wiring pattern.

Thus, according to the present invention, it becomes possible to simplify a production process and to reduce the production cost. Moreover, because specially produced bonding or adhering materials such as solder or anisotropic conductive sheets, which were essential to the prior art devices, are not required in the practice of attachment of chips, the production cost can be further reduced.

Further, since a thin silicon chip can be directly adhered (attached) to the glass substrate without using a bonding wire used in the wire bonding connection system or a bump used in the flip chip connection system, it becomes possible to reduce the total thickness of the resulting semiconductor device.

Furthermore, since a Coulomb's force-based adhesion (electrostatic adhesion) process and a conventional wiring pattern formation process are used in the adhesion step in the chip attachment and the subsequent connection step of the chip with the wiring pattern, i.e. since a "solder which can adversely affect environmental conditions", which was conventionally used in the prior art, is not used in the practice of the present invention, environmental pollution can be effectively prevented.

BRIEF DESCRIPTION OF THE DRAWINGS

FIG. 1 is a cross-sectional view schematically showing the semiconductor device according to one preferred embodiment of the present invention;

FIGS. 2A to 2I are cross-sectional views showing, in sequence, the production process of the semiconductor device of FIG. 1;

DESCRIPTION OF THE PREFERRED EMBODIMENTS

Figure 2G:
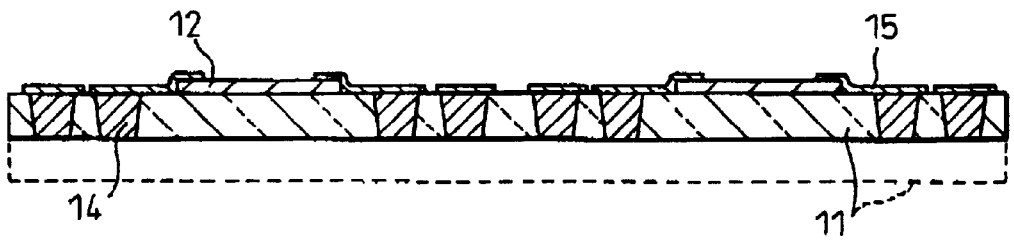

The semiconductor device and its production process according to the present invention will be further described with reference to the accompanying drawings. It should be noted, however, that the following embodiments are only several preferred embodiments of the present invention, and they may be modified or improved within the scope of the present invention.

FIG. 1 is a cross-sectional view schematically showing the semiconductor device according to one preferred embodiment of the present invention.

The illustrated semiconductor device 10 has a glass substrate 11, and one surface (an upper surface for the illustrated instance) of the glass substrate 11 has a semiconductor chip 12 directly adhered to the surface thereof by using the special method which was described above and will be further described hereinafter. Further, another surface (a lower surface for the illustrated instance) of the glass substrate 11 has a metal bump 13 as an external connecting terminal. The metal bump 13 is designed to be electrically connected to an electrode of the semiconductor chip 12.

The glass substrate 11 has an embedded conductor 14 which extends from an upper surface of the substrate 11 to a lower surface thereof. Further, the glass substrate 11 has a wiring pattern 15 formed on a surface thereof. The wiring pattern 15 electrically connects one end surface (an upper surface for the illustrated instance) of the conductor 14 with an electrode of the semiconductor chip 12. The metal bump (external connecting terminal) 13 is bonded to another surface (a lower surface for the illustrated instance) of the conductor 14, and is electrically connected through the conductor 14 and the wiring pattern 15 to an electrode of the semiconductor chip 12. Furthermore, a protective coating (insulating layer) 16 is formed over the semiconductor chip 12 and wiring pattern 15.

In the semiconductor device 10, any glass material can be used as the glass substrate 11. Examples of suitable glass material include, but are not restricted to, quartz glass, Vycor™ glass (high silicate glass) commercially available from Corning Co., sapphire glass and the like, and, as will be described hereinafter, if a semiconductor chip can be directly bonded to a surface of the substrate in accordance with the specific bonding method of the present invention, any other substrate materials may be used in place of the glass substrate.

Further, the semiconductor chip 12 can be produced using a wide variety of semiconductor materials and in accordance with any conventional thin-film formation method. Examples of suitable semiconductor materials include, but are not restricted to, silicon (Si), gallium arsenic (GaAs) and the like. The semiconductor chip is generally provided as a microprocessor, a memory element, an I/O device, a chip capacitor, a resistor and others. In these semiconductor devices, a silicon substrate is particularly advantageously used.

More particularly, it is preferred that the glass substrate 11 used herein contain silicon dioxide ($SiO_2$) as a principal component thereof, and particularly that a surface portion of the glass substrate 11 be constituted from $SiO_2$. Further, it is preferred that the semiconductor chip 12 including silicon chip be as thin as possible. The silicon chip is generally used at a very low thickness of about 5 to 10 $\mu$m.

Furthermore, any metal material can be used as the metal bump 13. Examples of suitable metal material for the bump include, but are not restricted to, conventional eutectic alloy solder such as lead-tin (Pb—Sn) solder and the like, lead-free solder such as silver-zinc (Ag—Sn) solder and the like, metals such as gold (Au), silver (Ag), copper (Cu) and nickel (Ni), and others. It should be noted, however, in the practice of the present invention, that to advantageously attain one of its objects, i.e. "inhibition or prevention of an adverse effect on environmental conditions", it is preferable not to use a solder bump containing lead, if possible.

Similarly, any conductive material, preferably metal material, can be used as the conductor 14. Examples of suitable conductive material for the conductor include, but are not restricted to, Cu, Ni, wolfram (W), aluminum (Al), titanium (Ti), tantalum (Ta), chromium (Cr) and others.

Furthermore, typically, Cu is used in the formation of the wiring pattern 15, although other conductive materials may be used for the same purpose, if desired. The wiring pattern 15 made of Cu or other materials may be used as a single layer. However, to realize highly increased conductivity, thereby increasing the reliability of the connection between the wiring pattern 15 and an electrode of the semiconductor chip 12, it is preferred that the wiring pattern 15 be further coated with, for examples Au, tin (Sn) and the like.

Moreover, in the formation of the protective insulating layer 16, any conventional insulating materials can be used. Examples of suitable insulating material for the insulating layer include, but are not restricted to, phospho-silicate glass (PSG), $SiO_2$, polyimide and other resins.

In the semiconductor device 10 of FIG. 1, an external connecting terminal (metal bump) 13 is applied to a bottom surface of the glass substrate 12. However, an external connecting terminal does not have to be provided in the semiconductor device, because, if desired, an external connecting terminal may be applied to the semiconductor device before practical use of the device, for example, just before attaching the semiconductor device to a packaging substrate such as a print circuit board or a mother board. In other words, the semiconductor device 10 of the present invention may have a final structure in which a lower end surface of the conductor 14 is exposed from a lower surface of the glass substrate 11 so that a metal bump 13 can be applied to the lower end surface of the conductor 14 at a later stage. It should be noted that in this structure of the semiconductor device 10, a lower end surface of the conductor 14 is referred herein to as a "terminal connecting portion", because it can act as a bonding portion for the external connecting terminal (metal bump) 13.

The semiconductor device 10 of FIG. 1 can be produced using different methods. According to the production process of the present invention, the semiconductor device 10 can be advantageously produced by the productiond process which will be described hereinafter with reference to FIGS. 2A to 2I, which are cross-sectional views showing, in sequence, the production process of the semiconductor device 10.

First, as is shown in FIG. 2A, a glass substrate 11 is provided. The glass substrate 11 comprises $SiO_2$ as a main component thereof, and a surface portion thereof essentially consists of $SiO_2$. The glass substrate 11 has a thickness higher than that of the corresponding glass substrate 11 of the resulting semiconductor device 10 (see, FIG. 1). Recesses 21 are formed at predetermined sites in a surface (upper surface for the illustrated instance) of the glass substrate 11. The recesses 21 can be formed, for example, by boring using $CO_2$ laser, YAG laser and other lasers, or etching using a plasma etcher and the like. It should be noted that the predetermined sites for the formation of the recesses 21 are specific sites in the area surrounding an area in which a silicon chip 12 is attached (adhered) to the glass substrate 11 in a latter step.

In the above production step for forming the recessed glass substrate 11, after formation of the recess 21 on the glass substrate 11, to increase intimate contact between the glass substrate 11 and a conductor layer formed in the next step, it is preferred that a surface of the glass substrate 11 be fogged, specifically, that a surface of the glass substrate 11 be roughened to obtain a surface condition such as that of frosted glass. The "fogging" can be carried out, for example, by treating the glass substrate 11 with fluoric acid.

Next, as is shown in FIG. 2B, a recess 21 formed on the glass substrate 11 is filled with a conductor material to form a conductor layer 22. For example, sputtering, electroles plating and electrolytic plating can be used in this filling step.

For example, Cr is deposited over a full surface, having the recess 21, of the glass substrate 11 with sputtering, and then Cu is deposited over the resulting Cr layer with sputtering to form a two(Cr/Cu)-layered metallic layer. Then, using the metallic layer as a current-supplying layer, Cu is deposited by electrolytic plating to form a Cu metallic layer. Thus, a conductor layer 22 is obtained. It should be noted that, in the two-layered metallic layer, the Cr layer as a lower layer is intended to increase the bonding strength between the conductor layer 22 and the underlying glass substrate 11.

In the resulting conductor layer 22, a portion filled in a recess 21, i.e. conductor 14, is used as a connecting means to bond an external connecting terminal in a later step. As is illustrated, a surface of the glass substrate 11 has a conductor layer 14a in areas other than in the recess 21, since a surface of the substrate 11 was fully plated.

Thereafter, as is shown in FIG. 2C, the unnecessary conductor layer 14a is removed from a surface of the glass substrate 11 to expose an upper end surface of the conductor 14 filled in the recess 21 of the substrate 11, followed by planarization to obtain a mirror surface in the substrate 11. The planarization of the substrate surface can be carried out, for example, by mirror polishing such as chemical polishing, mechanical polishing and chemical mechanical polishing (CMP). In FIG. 2C, the dotted line indicates a portion to be removed by the mirror polishing.

After completion of the planarization step, as is shown in FIG. 2D, a surface, having the exposed conductor 14, of the glass substrate 11 is treated, in a vacuum, with plasma (see, arrows P) to obtain an activated surface. Thus, reactive radicals are produced in the plasma treated areas (area A indicated with xxxx in the drawing) in a surface portion of the glass substrate 11.

After completion of the plasma treatment, as is shown in FIG. 2E, a back surface 12a (a surface opposed to a surface having an electrode) of the silicon chip 12 having a thickness of about 5 to 10 $\mu$m is adhered to an activated surface of the glass substrate 11 in a vacuum. The adhesion is electrostatic adhesion, and is based on a Coulomb's force generated between the radicals (negative charge) generated in the area A around the surface of the glass substrate 11 and the Si atoms constituting the silicon chip 12.

In the steps of FIGS. 2D and 2E, it can be seen that the silicon chip 12 is electrostatically adhered to the glass substrate 11 without applying any treatment to the silicon chip 12. However, if desired, before the electrostatic adhesion, a similar plasma treatment may be applied to a back surface 12a of the silicon chip 12, in addition to the glass substrate 11. In such a case, it is preferred in view of increasing the adhesion strength, that a back surface 12a of the silicon chip 12 be mirror-polished prior to the plasma treatment. The mirror polishing also serves to reduce the thickness of the silicon chip 12. Further, the silicon chip 12 can be adhered to the glass substrate 11 with increased adhesion strength if an annealing treatment is applied to the bonded structure of the chip 12 and the substrate 11. Generally, the annealing treatment is carried out at an elevated temperature of at least about 250° C.

Next, as is shown in FIG. 2F, a wiring pattern 15 having a predetermined profile is formed to connect a conductor 14 of the glass substrate 11 with an electrode of the silicon chip 12. For example, the wiring pattern 15 can be formed by patterning a resist layer, followed by depositing a wiring metal such as Cu, Al, Au, Cr and the like. As a typical example of the formation of the wiring pattern 15, the glass substrate 11 is sputtered with Cr to form a thin Cr layer, thereby increasing its adhesion property, and then Cu is deposited with sputtering to form the wiring pattern 15, after patterning of the resist layer.

In the wiring pattern formation step, a wiring pattern 15 can be easily produced in accordance with the patterning method similar to that applied for a flat surface of the substrate, because the thickness of the silicon chip 12 used herein is very low, and thus a step between an upper end surface of the chip 12 and a surface of the glass substrate 11 (an upper end surface of the conductor 14) is very small, i.e. substantially negligible.

Thereafter, as is shown in FIG. 2G, a back surface (a surface opposed to a surface having the wiring pattern 15) of the glass substrate 11 is polished by, for example, mechanical polishing, chemical mechanical polishing and the like, until an end surface of the conductor 14 is exposed from the back surface of the substrate 11. The glass substrate 11 is thus thinned to have the required thickness. In some cases, depending on the depth of the filled conductor 14, a lower end portion of the conductor 14 can be removed along with the substrate 11. In the drawing, the dotted line indicates a portion of the glass substrate 11 to be removed by polishing.

Figure 2H:
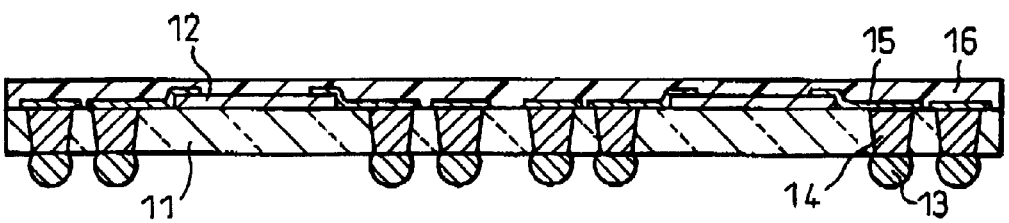

Following the above polishing step, as is shown in FIG. 2H a protective layer (insulating layer) 16 is formed to cover a wiring pattern 15 and an exposed silicon chip 12 on a surface of the glass substrate 11, while a metal bump (external connecting terminal) 13 such as Au bump or Ag bump is bonded to an end surface (terminal connecting portion) of the conductor 14 which is exposed from a back surface of the substrate 11. For example, the metal bump 13 can be suitably produced from an Au stud bump using a wire bonding apparatus.

The protective layer 16 may have different embodiments. Typical embodiments of the protective layer 16 include, but are not restricted to, phospho-silicate glass (PSG) formed by a chemical vapor deposition (CVD) method, a silicon oxide layer ($SiO_2$), a coating of the resin, preferably light-sensitive resin, such as polyimide resin and epoxy resin, and the like.

In the illustrated instance described above, an external connecting terminal 13 is bonded to the end surface of the conductor 14. However, as has been described above, an external connecting terminal is not essentially required in the semiconductor device of the present invention. In other words, a lower end surface (terminal connecting portion) of the conductor 14 may be retained as the exposed one so that an external connecting terminal can be bonded to the exposed end surface of the conductor 14 at a later stage.

Further, in the steps described above with reference to FIGS. 2G and 2H, a protective layer 16 was formed after a back surface of the glass substrate 11 was polished until an end surface of the conductor 14 was exposed. If desired, these steps may be carried out in reverse order, i.e., an end surface of the conductor 14 may be exposed by conducting, in order, formation of a protective layer 16 on a surface of the glass substrate 11, and polishing of a back surface of the substrate 11.

Figure 2I:
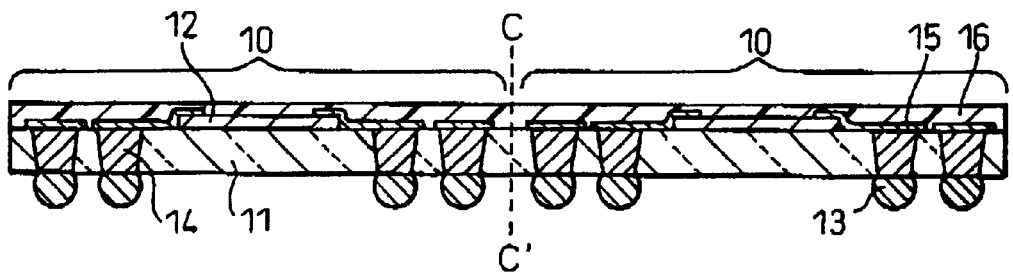

As the last step, as is shown in FIG. 2I, a glass substrate 11 is separated along a cutting line C–C' shown with a dotted line with a cutting tool such as a dicer to produce packages each having an attached silicon chip 12. A semiconductor device 10 as described above with reference to FIG. 1 is thus obtained.

As described above with reference to the attached drawings, according to the semiconductor device 10 and the production process thereof of the present invention, using a Coulomb's force created between (1) reactive radicals on a surface area A of the plasma treated and thus activated glass substrate 11 and (2) Si atoms constituting the silicon chip 12, the silicon chip 12 can be directly bonded to the glass substrate 11 by the electrostatic adhesion (see, FIG. 2E), and, at the same time, in the formation of the wiring pattern 15 to be electrically connected through a conductor 14 to an external connecting terminal (metal bump) of the glass substrate 11, the formation of the wiring pattern 15 and its connection to an electrode of the silicon chip 12, i.e. attachment of chip 12, can be carried out simultaneously (see FIG. 2F). In other words, while the formation of the wiring pattern and the attachment of the chips had to be separately carried out in the prior art devices, they can be carried out in one same step according to the present invention.

As a result, according to the present invention, it becomes possible to simplify a production process and thus reduce the production cost. In addition, the production cost can be further reduced, because special adhering materials such as an anisotropic conductive sheet used in the prior art are not required in the attachment of chips.

Further, as a whole, the semiconductor device can be thinned, because a thin film semiconductor chip can be directly bonded (attached) to the glass substrate without using a bonding wire for the wire bonding connection system or a bump for the flip chip connection system.

Furthermore, environmental pollution can be prevented, because the adhesion of the silicon chip and its bonding with a wiring pattern in the attachment of the silicon chip can be carried out by adhesion utilizing a Coulomb's force (electrostatic adhesion) and the conventional processing for the wiring pattern without using a "solder which can adversely affect environmental conditions" conventional in the prior art.

Moreover, since a surface of the glass substrate has a high degree of flatness, it becomes possible to previously fabricate therein, by a lithographic process, electronic elements such as a simple circuit and the like as a thin film.

The above embodiment of the semiconductor device was described with reference to use of a glass substrate as a substrate of the device. However, the substrate used herein is not restricted to the glass substrate, and any other substrate materials may be used, if desired. As can be appreciated from the description of the paragraph "Summary of the Invention", the substrate used is satisfactory if it has a crystal orientation direction of similar to that of the silicon chip or other semiconductor chips to be adhered (attached) through an electrostatic adhesion to the substrate. For example, a silicon wafer which is conventionally used in the semiconductor process may be used in place of the glass substrate.

When the semiconductor device of the present invention is produced using a silicon wafer as the substrate, the constitution and production process of the semiconductor device are basically the same as those of the above-described embodiment, and thus a detailed description will be omitted here to avoid duplication. It should be noted, however, when using a wafer made of silicon as a semiconductor material, that an additional process for importing an insulating property to a surface of the silicon wafer is required, in contrast to use of the substrate made of glass as an insulating material.

A typical example using the silicon wafer will be described below with reference to FIGS. 2A to 2H: After a recess 21 is formed on one surface of silicon wafer, used in place of glass substrate, in the step of FIG. 2A, a surface of the silicon substrate is oxidized (thermally oxidized) in an atmosphere of oxygen ($O_2$) or water vapor or a mixture thereof at an elevated temperature to form an oxide ($SiO_2$) layer. More specifically, a surface of the silicon wafer is chemically treated so that it has the chemical structure ($SiO_2$) similar to that of the glass substrate. The formation of the oxide layer may be carried out, for example, by laser annealing such as $CO_2$ laser, YAG laser and the like, in place of the thermal oxidization. After formation of the oxide layer on the silicon wafer, the steps of FIGS. 2B to 2G are repeated. Then, in the step of FIG. 2H, an oxide layer (insulating layer) 16 is formed over a surface of the silicon substrate, a metal bump 13 is bonded to an external connecting portion formed on a back surface of the silicon wafer, and an insulating layer is deposited on the overall area of the back surface of the silicon wafer except for the external connecting portion.

Further, in the above embodiment of the semiconductor device, the formation of a conductor layer 22 using a combination of the Cr/Cu sputtering and the Cu electrolytic plating was described with reference to FIG. 2B. However, the formation of the conductor layer 22 is not restricted to the process illustrated in FIG. 2B. Another method for forming the conductor layer 22 will be described hereinafter with reference to FIGS. 3A and 3B.

Figure 3A:
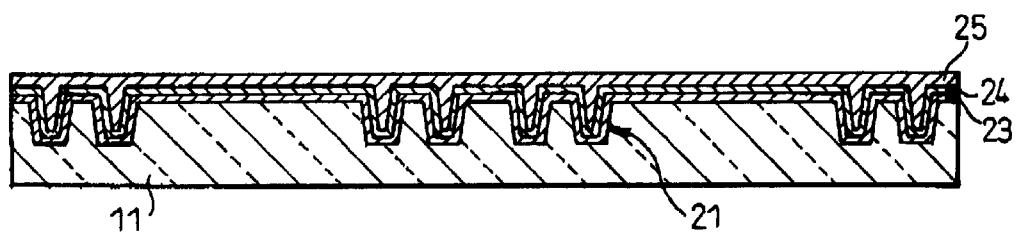
FIGS. 3A and 3B are cross-sectional views showing one modification of the production process explained with reference to FIGS. 2B and 2C.

In the conductor layer formation method of FIGS. 3A and 3B, first, as is illustrated in FIG. 3A, to increase adhesion between a glass substrate 11 and a conductor layer formed thereon in a later step, a Ni layer 23 is formed on the surface of the glass substrate 11 with electroless Ni plating. Then, to assist in the reduction of electrical resistance during the subsequent Cu electrolytic plating, an Au layer 24 is formed at a very low thickness over the Ni layer 23 with electroless Au plating or a flash plating process such as electrolytic Au plating. Finally, to fill a recess 21, a cu layer (conductor layer) 25 is formed with electrolytic Cu plating. It should be noted, however, that in an alternate method, a Cu plating (corres. to the reference numeral 24) is formed with electroless Cu plating over a Ni layer 23, followed by forming a Cu plating layer 25 with electrolytic Cu plating.

Figure 3B:
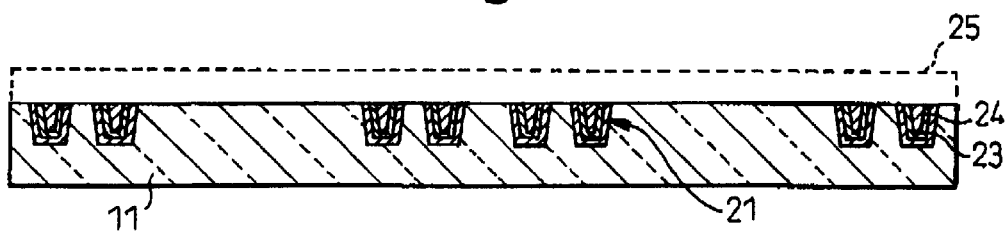

Thereafter, as is shown in FIG. 3B, an upper end surface of the conductor 14 filled in the recess 21 of the glass substrate 11 is exposed, and an exposed surface of the substrate 11 is processed so as to have a mirror other than the recess 21 of the substrate 11, i.e. the Cu layer 25, the Au layer 24 and the Ni layer 23, are selectively removed from the substrate 11, and an exposed surface of the substrate 11 is planarized. The planarization can be carried out by a mirror polishing process such as chemical polishing, mechanical polishing or chemical mechanical polishing (CMP). In FIG. 3B, the dotted line indicates a portion removed by mirror polishing.

Using this plating method, since all the conductive layers are formed through plating on the glass substrate 11, there is an advantage in that the production cost can be reduced in comparison with use of the sputtering method mentioned above.

Figure 4:
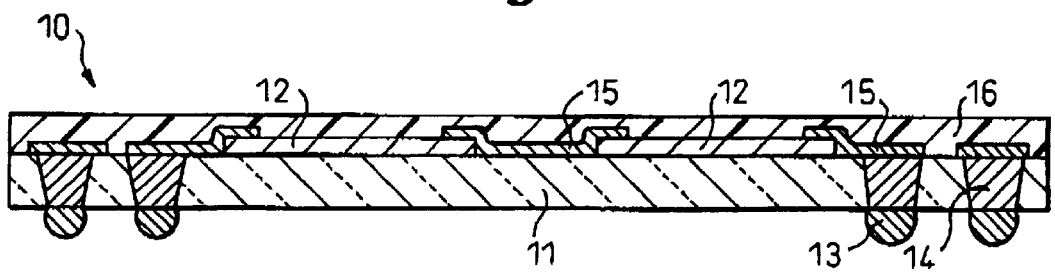
FIG. 4 is a cross-sectional view showing one modification of the semiconductor device of FIG. 1.

The semiconductor device 10 of FIG. 1 described above is one embodiment having a single attached semiconductor chip 12 on a glass substrate 11. The semiconductor device 10, however, may comprise two or more semiconductor chips packaged therein. FIG. 4 illustrates a semiconductor device 10 having two semiconductor chips 12 on a glass substrate 11 wherein the semiconductor chips 12 are connected to each other through a wiring pattern 15.

Moreover, as a modification of the above-described embodiment, the semiconductor device 10 may have a stacked and laminated structure (three-dimensional attachment structure), since the semiconductor device 10 can be provided as a thinned structure according to the present invention. On preferred embodiment of the semiconductor device having the three-dimensional attachment structure will be described below with reference to FIG. 5.

Figure 5:
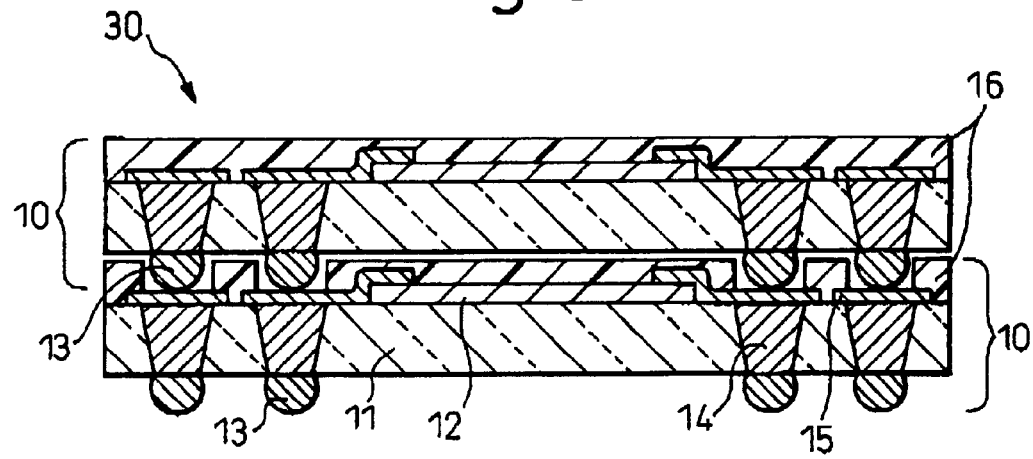
FIG. 5 is a cross-sectional view schematically showing the semiconductor device according to another preferred embodiment of the present invention.

The embodiment of FIG. 5 shows a composite semiconductor device 30 having a three-dimensional attachment structure in which two semiconductor devices 10, described above, are stacked, while a metal bump 13 of an upper seniconductor device 10 is electrically connected with a wiring pattern 15 of a lower semiconductor device 10. In this composite semiconductor device 30, a protective layer 16 of the lower semiconductor device 10 has an opening portion through which an external connecting terminal (metal bump 13) of the upper semiconductor device 10 is connected to the wiring pattern 15 of the lower semiconductor device 10. The opening portion can be formed, for example, by plasma etching (PSG, $SiO_2$) or exposure and development (using a light-sensitive resin).

According to the embodiment illustrated in FIG. 5. in addition to the effects described above with regard to the semiconductor device 10 of FIGS. 1 to 4, there can be obtained additional advantages in that as a total structure, a compact semiconductor device can be provided because each semiconductor device 10 has a reduced thickness and both the integration and function of the device can be improved as a result of the introduction of the three-dimensional attachment structure.

In addition to the above embodiments, the semiconductor device of the present invention can be advantageously realized in the form of other embodiments.

Figure 6:
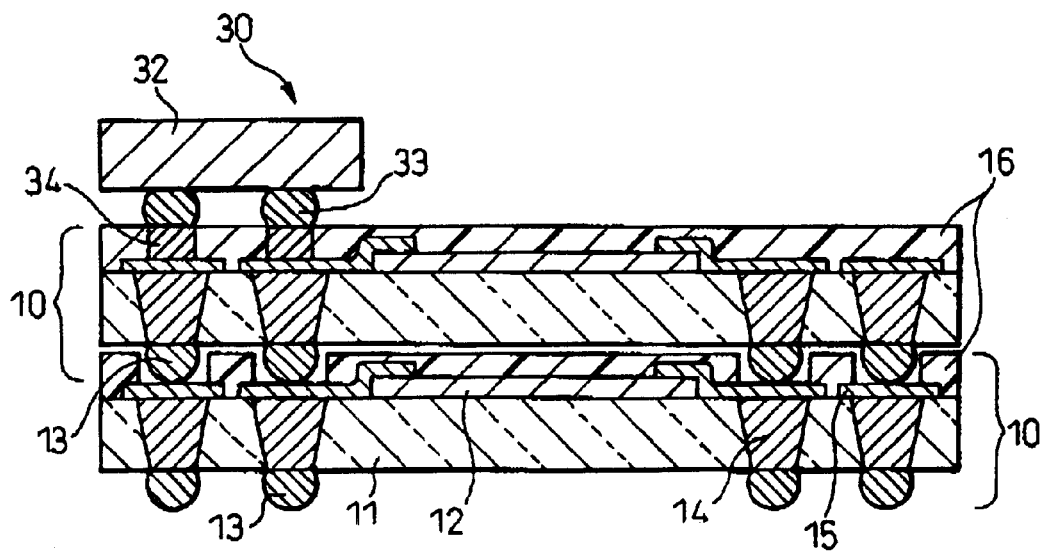
FIG. 6 is a cross-sectional view schematically showing the semiconductor device according to another preferred embodiment of the present invention.

For example, the composite semiconductor device 30 of FIG. 5 may be modified as is shown in FIG. 6, in which an additional chip 32 is attached to the upper semiconductor device 10. In the composite semiconductor device 30, after an opening portion was formed in a protective layer 16 of the upper semiconductor device 10 and a metal post 34 Made of Cu was inserted into the opening portion, a semiconductor chip 32 can be mounted through a solder bump 33 onto the upper semiconductor device 10. In the connection between the semiconductor chip 32 and the semiconductor device 10, if desired, any other bonding means may be used in place of the solder bump. Moreover, a TAB system, an FC system or other systems may be used as the bonding means.

Figure 7:
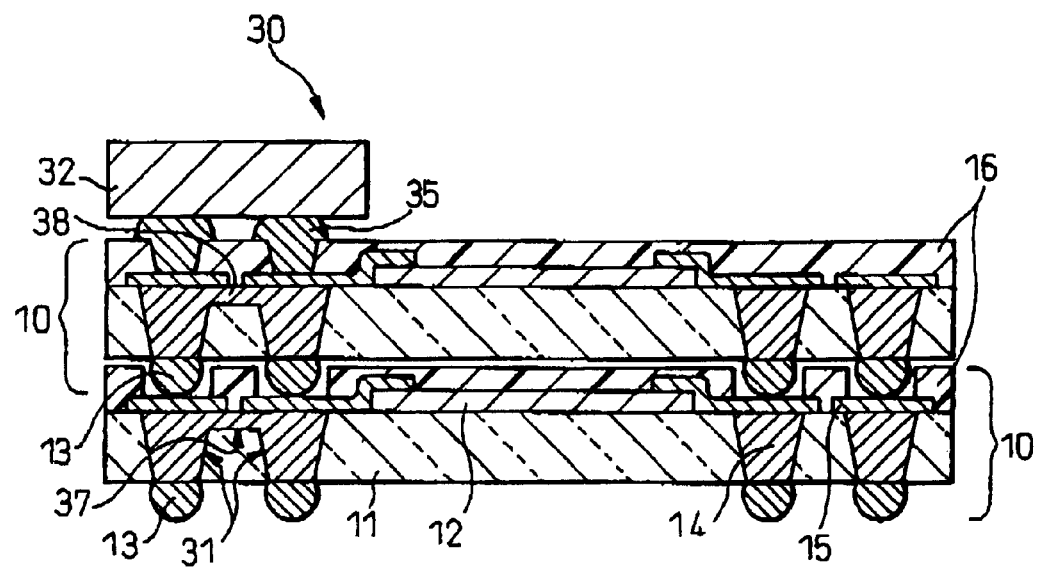
FIG. 7 is a cross-sectional view schematically showing the semiconductor device according to still another preferred embodiment of the present invention.

FIG. 7 shows still another embodiment of the composite semiconductor device 30 having a three-dimensional attachment structure. The semiconductor device 30, as in the device of FIG. 6 described above, has an additional semiconductor chip 32. In the semiconductor device 30, an opening portion is formed in a protective layer 16 of the upper semiconductor device 10, and a semiconductor chip 32 is mounted through an Au bump 35 onto the upper semiconductor device 10. Further, in each of the semiconductor devices 10 constituting the semiconductor device 30, as is shown in the drawing, the adjacent conductors 14 are electrically connected to each other through a conductor 38 filled in a groove 37.

In the composite semiconductor device 30 of FIG. 7, the connection of the conductors 14 through the conductor 38 filled in the groove 37 can be easily carried out by modifying the method described above, referring to FIGS. 2A to 2C.

Figure 8A:
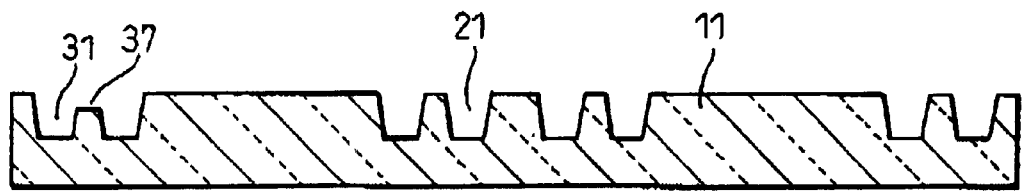
FIGS. 8A to 8C are cross-sectional views showing, in sequence, intermediate steps of the production process of the semiconductor device of FIG. 7.

First, as is shown in FIG. 8A, after a glass substrate 11 comprising $SiO_2$ as a main component thereof and having a thickness greater than the desired thickness of the glass substrate in the semiconductor device 10 was provided, recesses 21 and 31 are formed at predetermined sites in one surface of the glass substrate 11. The recess 31, as illustrated, is a combination of two recesses 21 and also has a communicating groove 37. These recesses can be formed by boring, etching and the like. In this step, to increase intimate contact between the glass substrate 11 and a conductor layer formed in the next step. It is preferred that, after formation of the recesses 21 and 31, a surface of the glass substrate 11 be fogged.

Figure 8B:
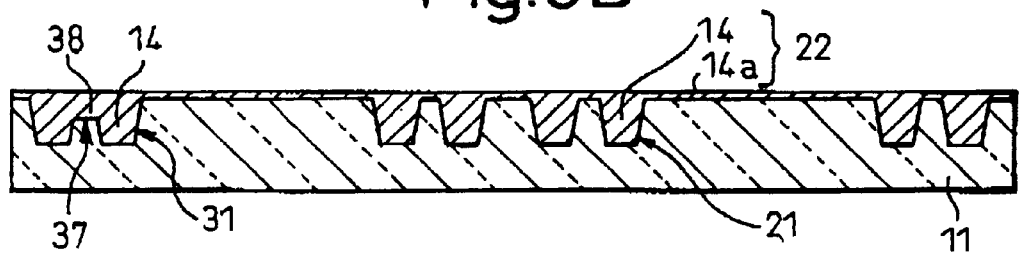

Next, as is shown in FIG. 8B, the recesses 21 and 31 and the groove 37 formed on the glass substrate 11 are filled with a conductor material to form a conductor layer 22. Sputtering, electroless plating, electrolytic plating and the like can be used in this filling step.

As described above, the conductor layer 22 can be advantageously formed by depositing Cr over a full surface, having the recesses 21 and 31 and the groove 37, of the glass substrate 11 with sputtering, followed by depositing Cu over the resulting Cr layer with sputtering to form a two (Cr/Cu)-layered metallic layer. Then, using the metallic layer as a current-supplying layer, Cu is deposited overall by electrolytic plating to form a Cu metallic layer. As is illustrated, the conductor layer 22 consisting of the conductor 14 filled in the recesses 21 and 31 and the groove 37 and the conductor layer 14a on the glass substrate 11 is formed.

Figure 8C:
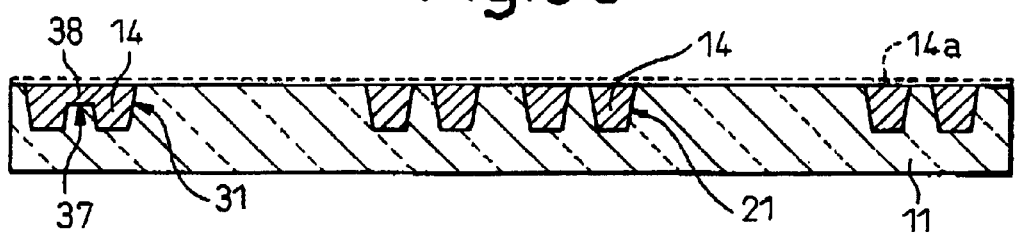

Thereafter, as is shown in FIG. 8C, the unnecessary conductor layer 14a is removed from a surface of the glass substrate 11 to expose an upper end surface of the conductor 14 filled in the recesses 21 and 31 and the groove 37 of the substrate 11, followed by planarization to obtain a mirror surface in the substrate 11. The planarization can be carried out, for example, by mirror polishing. In FIG. 8C, the dotted line indicates a portion to be removed by mirror polishing.

Figure 9:
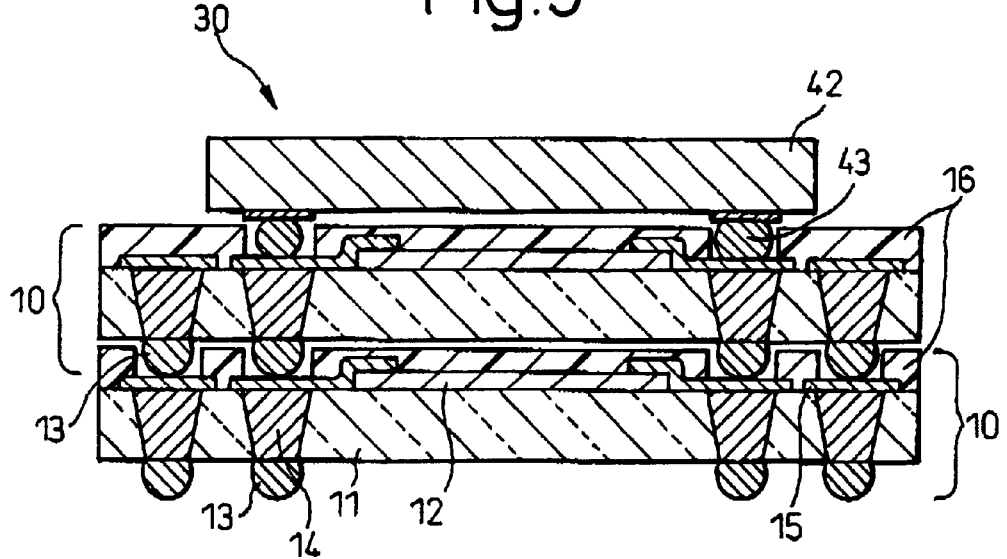
FIG. 9 is a cross-sectional view schematically showing the semiconductor device according to still another preferred embodiment of the present invention.

The semiconductor device 30 of FIG. 7 may be modified as is shown in FIG. 9. In this semiconductor device 30, a semiconductor chip 42 is mounted through a solder ball 43 on the upper semiconductor device 10 with a FC bonding system, after an opening portion is bored in a protective layer 16 of the upper semiconductor device 10. Of course, if desired, any other bonding means may be used in achieving the connection between the semiconductor chip 42 and the semiconductor device 10.

As explained in the above paragraphs, according to the present invention, by utilizing electrostatic adhesion based on a Coulomb's force which is generated between a plasma treated and thus activated surface of the glass substrate and the like and a thin film silicon chip, the production process can be simplified along with a reduction of the production cost. Further, a reduction in the thickness of the semiconductor device can be attained and environmental pollution prevented.

What is claimed is:

1. A semiconductor device comprising a wiring substrate having attached thereto at least one semiconductor element, in which said semiconductor element is directly bonded through a Coulomb's force created between radicals of the atoms constituting said semiconductor element and reactive radicals on a surface of said wiring substrate, and a wiring pattern formed on the surface of said wiring substrate extends onto a surface of said semiconductor element and is electrically connected with an electrode formed on the surface of said semiconductor element.

2. The semiconductor device according to claim 1, in which said wiring pattern has a planarized surface.

3. The semiconductor device according to claim 1, in which a bonding surface of said semiconductor element has a mirror-polished surface.

4. The semiconductor device according to claim 1, in which a surface of said wiring substrate has reactive radicals produced upon activation of the surface by a plasma treatment.

5. The semiconductor device according to claim 1, in which said wiring substrate further comprises a conductor formed through the wiring substrate, and an end surface of said conductor exposed at a semiconductor element side of said wiring substrate is electrically connected with said wiring pattern.

6. The semiconductor device according to claim 5, in which another end surface of said conductor, exposed at another surface of said wiring substrate opposed to said semiconductor element side, further comprises an external connecting terminal.

7. The semiconductor device according to claim 1, in which said wiring substrate has a protective insulating layer as the uppermost layer.

8. The semiconductor device according to claim 7, in which said insulating layer has an opening portion at a predetermined site thereof to expose the underlying wiring pattern, and an additional semiconductor element is mounted through said opening portion on said semiconductor substrate.

9. The semiconductor device according to claim 1, in which said wiring substrate and said semiconductor element have substantially the same crystal orientation direction.

10. The semiconductor device according to claim 9, in which said wiring substrate is a glass substrate, and said semiconductor element is based on a silicon substrate.

11. The semiconductor device according to claim 9, in which said wiring substrate is a silicon substrate having an insulating layer on a surface thereof, and said semiconductor element is based on a silicon substrate.

12. The semiconductor device according to claim 1, in which said semiconductor device has a three-dimensional packaging embodiment provided by stacking of two or more of said semiconductor devices, and an external connecting terminal formed on the wiring substrate of an upper semiconductor device is electrically connected with the wiring pattern of a lower semiconductor device adjacent to the upper semiconductor device.

* * * * *